US009543197B2

(12) United States Patent
Hu et al.

(10) Patent No.: US 9,543,197 B2
(45) Date of Patent: Jan. 10, 2017

(54) PACKAGE WITH DIELECTRIC OR ANISOTROPIC CONDUCTIVE (ACF) BUILDUP LAYER

(71) Applicant: INTEL CORPORATION, Santa Clara, CA (US)

(72) Inventors: Chuan Hu, Chandler, AZ (US);
Dingying Xu, Maricopa, AZ (US);
Yoshihiro Tomita, Tsukuba (JP)

(73) Assignee: INTEL CORPORATION, Santa Clara, CA (US)

( * ) Notice: Subject to any disclaimer, the term of this patent is extended or adjusted under 35 U.S.C. 154(b) by 656 days.

(21) Appl. No.: 13/719,836

(22) Filed: Dec. 19, 2012

(65) Prior Publication Data

US 2014/0167217 A1    Jun. 19, 2014

(51) Int. Cl.
*H01L 21/00* (2006.01)
*H01L 21/768* (2006.01)
(Continued)

(52) U.S. Cl.
CPC ....... *H01L 21/76838* (2013.01); *H01L 21/561* (2013.01); *H01L 21/568* (2013.01);
(Continued)

(58) Field of Classification Search
CPC ............. H01L 23/568; H01L 21/76838; H01L 21/561; H01L 24/19; H01L 24/24; H01L 21/568; H01L 24/73; H01L 24/96; H01L 23/5389; H01L 23/3128; H01L 2224/131; H01L 2224/2919
(Continued)

(56) References Cited

U.S. PATENT DOCUMENTS 6,060,778 A    5/2000  Jeong et al.
8,034,659 B2   10/2011 Nagai et al.
(Continued)

FOREIGN PATENT DOCUMENTS

CN    1277737 A    12/2000
CN    1956189 A     5/2007
(Continued)

OTHER PUBLICATIONS

Japanese Office Action issued in corresponding Japanese Application No. 2013-261008, mailed Sep. 2, 2014, 11 pages.
(Continued)

*Primary Examiner* — Thinh T Nguyen
(74) *Attorney, Agent, or Firm* — Schwabe, Williamson & Wyatt, P.C.

(57) ABSTRACT

Embodiments of the present disclosure are directed to techniques and configurations for an integrated circuit (IC) package having one or more dies connected to an integrated circuit substrate by an interface layer. In one embodiment, the interface layer may include an anisotropic portion configured to conduct electrical signals in the out-of-plane direction between one or more components, such as a die and an integrated circuit substrate. In another embodiment, the interface layer may be a dielectric or electrically insulating layer. In yet another embodiment, the interface layer may include an anisotropic portion that serves as an interconnect between two components, a dielectric or insulating portion, and one or more interconnect structures that are surrounded by the dielectric or insulating portion and serve as interconnects between the same or other components. Other embodiments may be described and/or claimed.

23 Claims, 8 Drawing Sheets

(51) Int. Cl.
*H01L 23/00* (2006.01)
*H01L 21/56* (2006.01)
*H01L 23/538* (2006.01)
*H01L 23/31* (2006.01)
*H01L 25/16* (2006.01)

(52) U.S. Cl.
CPC .......... *H01L 23/5389* (2013.01); *H01L 24/19* (2013.01); *H01L 24/24* (2013.01); *H01L 24/73* (2013.01); *H01L 24/96* (2013.01); *H01L 23/3128* (2013.01); *H01L 24/13* (2013.01); *H01L 24/16* (2013.01); *H01L 24/29* (2013.01); *H01L 24/32* (2013.01); *H01L 24/81* (2013.01); *H01L 24/83* (2013.01); *H01L 24/91* (2013.01); *H01L 25/16* (2013.01); *H01L 2224/12105* (2013.01); *H01L 2224/131* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/16225* (2013.01); *H01L 2224/16227* (2013.01); *H01L 2224/27002* (2013.01); *H01L 2224/27003* (2013.01); *H01L 2224/2784* (2013.01); *H01L 2224/27334* (2013.01); *H01L 2224/293* (2013.01); *H01L 2224/2919* (2013.01); *H01L 2224/2929* (2013.01); *H01L 2224/29078* (2013.01); *H01L 2224/32225* (2013.01); *H01L 2224/73104* (2013.01); *H01L 2224/73204* (2013.01); *H01L 2224/81191* (2013.01); *H01L 2224/81203* (2013.01); *H01L 2224/8385* (2013.01); *H01L 2224/83191* (2013.01); *H01L 2224/83203* (2013.01); *H01L 2224/83851* (2013.01); *H01L 2224/96* (2013.01); *H01L 2224/97* (2013.01); *H01L 2924/12042* (2013.01)

(58) Field of Classification Search
USPC ........ 438/124, 123, 127, 126, 118; 257/531, 257/734, 532, 536, E21.001, 783
See application file for complete search history.

(56) References Cited

U.S. PATENT DOCUMENTS

| | | | | |
|---|---|---|---|---|
| 2003/0217805 | A1* | 11/2003 | Takayama | H01L 21/2007 156/249 |
| 2005/0169033 | A1 | 8/2005 | Sugita et al. | |
| 2006/0013680 | A1* | 1/2006 | Haba | B23K 26/0846 414/800 |
| 2006/0196600 | A1* | 9/2006 | Nam | H05K 3/323 156/272.8 |
| 2007/0141330 | A1* | 6/2007 | Morishima | H01L 21/6835 428/343 |
| 2008/0176362 | A1* | 7/2008 | Sengupta | H01L 21/563 438/123 |
| 2009/0267173 | A1* | 10/2009 | Takahashi | H01L 27/14625 257/434 |
| 2010/0003771 | A1* | 1/2010 | Nagai | H01L 21/6835 438/15 |
| 2010/0263794 | A1* | 10/2010 | George | H01L 21/67092 156/707 |
| 2011/0014775 | A1* | 1/2011 | Akiyama | H01L 21/76256 438/458 |
| 2011/0228506 | A1* | 9/2011 | Chen | H01L 22/32 361/810 |
| 2011/0316146 | A1* | 12/2011 | Pagaila | H01L 24/19 257/737 |
| 2014/0302643 | A1* | 10/2014 | Saito | H01L 24/75 438/126 |

FOREIGN PATENT DOCUMENTS

| | | |
|---|---|---|
| JP | 2004128286 A | 4/2004 |
| JP | 2007-165928 A | 6/2007 |
| JP | 2009527893 A | 7/2009 |
| JP | 2012109306 A | 6/2012 |
| WO | WO 01/42893 A1 | 6/2001 |

OTHER PUBLICATIONS

Office Action mailed Jun. 28, 2016 for Japanese Application No. 2013-261008, 7 pages.
Office Action mailed Sep. 29, 2015 for Japanese Application No. 2013-261008, 7 pages.

* cited by examiner

PACKAGE WITH DIELECTRIC OR ANISOTROPIC CONDUCTIVE (ACF) BUILDUP LAYER

FIELD

Embodiments of the present disclosure generally relate to the field of integrated circuits, and more particularly, to techniques and configurations for an integrated circuit (IC) package with accurate component-to-component alignment.

BACKGROUND

Wafer Level Ball Grid Array (WLB) technology has been used to build integrated circuit packages on silicon wafers. In WLB packages, the interconnects are in a fan-in arrangement. In contrast, Embedded Wafer Level Ball Grid Array (eWLB) technology is used to build packages on an artificial wafer made from singulated chips and a casting compound. Typically, the die is mounted face down on a support by a pick and place (PnP) tool, over-molded, and cured. The support is then removed and interconnects are built on the exposed face of the die in a fan-out arrangement.

The fan-out arrangement provides more space for interconnect routing than in traditional WLB packages. However, current eWLB technology has several drawbacks. First, the pick and place (PnP) tools used to place the components are expensive and have a limited throughput capacity, and not all components need the same placement accuracy. In addition, the components can shift during the molding and curing process. High density/high bandwidth routing is not viable due to poor die (component) to die (component) alignment accuracy. Next, the placement of dies or other components onto die attach film (DAF) on the support by PnP tools can leave voids trapped under the die or component. Finally, the interconnects are made with either laser drilled vias or photo defined vias, which can be suboptimal in cost or performance.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

FIG. 5 schematically illustrates a cross-section view of dies positioned on a support for use in fabrication of an example IC package assembly, in accordance with some embodiments.

FIG. 6 schematically illustrates a cross-section view of an example support and interface layer for use in fabrication of an IC package assembly, in accordance with some embodiments.

FIG. 7 schematically illustrates a cross-section view of components of an example IC package assembly subsequent to placing an interface layer over one or more dies, in accordance with some embodiments.

FIG. 8 schematically illustrates a cross-section view of dies and interface layer compressed between supports subsequent to placing an interface layer over one or more dies, in accordance with some embodiments.

FIG. 9 schematically illustrates an example IC package assembly subsequent to removal of a support from components of the IC package assembly, in accordance with some embodiments.

FIG. 10 schematically illustrates an example IC package assembly subsequent to addition of an electronic component, in accordance with some embodiments.

FIG. 11 schematically illustrates an example IC package assembly subsequent to addition of a molding material, in accordance with some embodiments.

FIG. 12 schematically illustrates an example IC package assembly subsequent to removal of a support, in accordance with some embodiments.

FIG. 13 schematically illustrates an example IC package assembly subsequent to planing of the interface layer, in accordance with some embodiments.

DETAILED DESCRIPTION

Figure 1:
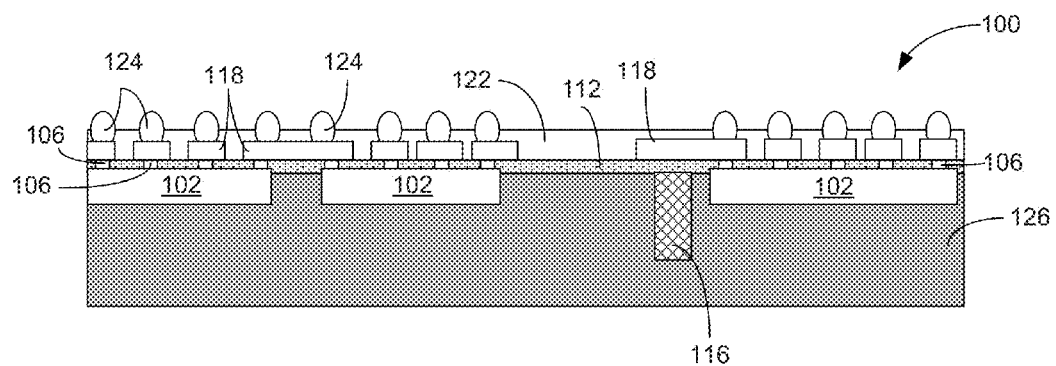
FIG. 1 schematically illustrates a cross-section view of an example integrated circuit (IC) package assembly, in accordance with some embodiments.

Embodiments of the present disclosure describe techniques and configurations for an integrated circuit (IC) package with accurate component-to-component alignment. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "interface layer" may mean a continuous or discontinuous layer that is formed, deposited, or disposed between a die and an integrated circuit substrate. The interface layer, or some portion thereof, may be in direct contact (e.g., direct physical and/or electrical contact) or indirect contact (e.g., separated by one or more other layers) with one or more of the die(s) and the integrated circuit substrate.

Embodiments of the present disclosure describe techniques and configurations for an integrated circuit (IC) package. In some embodiments, an IC package may include one or more dies connected to an integrated circuit substrate by an interface layer. In some embodiments, the interface layer may include an anisotropic portion configured to conduct electrical signals in the out-of-plane direction, relative to a plane formed/defined by the interface layer, between one or more components (e.g., between the die(s) and the integrated circuit substrate). For example, the interface layer may be a full/continuous anisotropic interface layer that serves as an interconnect between one or more dies and an integrated circuit substrate. Alternatively, the interface layer may be a dielectric or insulating layer. As another alternative, the interface layer may include an anisotropic portion, a dielectric or insulating portion, and one or more interconnect structures surrounded by the dielectric or insulating portion. The anisotropic portion may serve as an interconnect between a die/component and an integrated circuit substrate, and the dielectric or insulating portion may serve as an interconnect between the same or different die and the integrated circuit substrate. Principles described herein with regard to the interface layer are not limited to these examples and may be applied to other types of substrates (e.g., a circuit board) in other embodiments.

FIG. 1 schematically illustrates an example integrated circuit (IC) package assembly 100, in accordance with some embodiments. The IC package assembly 100 may include one or more dies (hereinafter "die 102") coupled with an integrated circuit substrate 122 by an interface layer 112. In some embodiments, one or more die interconnect structures (hereinafter "interconnect structures 106" may also connect the die(s) 102 to the integrated circuit substrate 122. In various embodiments, the die 102 and the integrated circuit substrate 122 may each be referred to as an "IC substrate."

The die(s) 102 may include a substrate composed of a semiconductor material upon which electrical devices such as, for example, transistors and associated circuitry are formed. The active side of a die 102 may have one or more transistor devices formed thereon. In some embodiments, a die 102 may represent a discrete chip and may be, include, or be a part of, a processor, memory, or ASIC.

The integrated circuit substrate 122 may include a laminate substrate composed of a polymer such as epoxy upon which traces or other circuitry may be formed. In some embodiments, the integrated circuit substrate 122 is an epoxy-based laminate substrate having a core and/or one or more build-up (BU) layers such as, for example, an Ajinomoto Build-up Film (ABF) substrate. The integrated circuit substrate 122 may include other suitable types of substrates in other embodiments including, for example, substrates formed from glass, ceramic, or semiconductor materials. In some embodiments, the integrated circuit substrate 122 may be an interposer. The die 102 and the integrated circuit substrate 122 are not limited to these example materials and may include other suitable well-known materials in other embodiments.

The interface layer 112 may be an anisotropic layer, a dielectric or electrically insulating layer, or a layer with one or more anisotropic portions and one or more dielectric portions. In some embodiments, the interface layer 112 may have a thickness in the range of 5-30 μm (e.g., 5-25 μm, 6-20 μm, 7-15 μm). A first surface or side (e.g., an active side) of the die(s) 102 may be attached to one side of the interface layer 112, and the integrated circuit substrate 122 may be attached to an opposite second side of the interface layer 112.

In some embodiments, the die(s) 102 may be connected to the integrated circuit substrate 122 by one or more interconnect structures 106 such as bumps, pillars, or other suitable structures. In some embodiments, the interconnect structures 106 may be configured to route electrical signals to or from the die 102. The electrical signals may include, for example, input/output (I/O) signals and/or power or ground signals associated with the operation of the die 102. In some embodiments, interconnect structures 106 can include solderable material (e.g., solder bumps) connected to bond pads on the active side of the die 102. In some embodiments, the interconnect structures 106 may be configured as an array of bumps.

The integrated circuit substrate 122 may include interconnect elements 118 configured to route electrical signals to or from the die 102. The interconnect elements 118 may include, for example, traces (not shown) disposed on one or more surfaces of the integrated circuit substrate 122 and/or internal structures such as, for example, trenches, vias or other interconnect structures to route electrical signals through the integrated circuit substrate 122. For example, in some embodiments, the interconnect elements 118 may be, or may include, structures configured to receive the die interconnect structures 106 and route electrical signals between the die 102 and the integrated circuit substrate 122. The interconnect structures 106 or portion thereof (e.g., solderable material) can be connected to corresponding interconnect elements 118 (e.g., die bond pads) on the integrated circuit substrate 122 to form an electrically conductive bond between the die 102 and the integrated circuit substrate 122.

The integrated circuit substrate 122 may be configured to electrically couple with another external component (e.g., a circuit board such as circuit board 130 of FIG. 3 and/or motherboard 1402 of FIG. 14) using one or more package interconnect structures (hereinafter "interconnect structures 124"). The interconnect structures 124 may include, for example, solderable material (e.g., solder balls) coupled to interconnect elements 118. The interconnect structures 124 may be configured to route the electrical signals (e.g., I/O and/or power) to or from the integrated circuit substrate 122.

The interconnect structures 124 may be arranged in a ball-grid array (BGA) configuration in some embodiments.

The interconnect structures 106, 124 and interconnect elements 118 may be composed of any of a wide variety of electrically conductive materials including metals such as, for example, gold, copper, aluminum, silver, tin, palladium, or nickel. The interconnect structures 106, 124 and/or interconnect elements 118 may include other suitable structures or configurations than depicted in other embodiments such as, for example, posts or other well-known structures or configurations.

Figure 3:
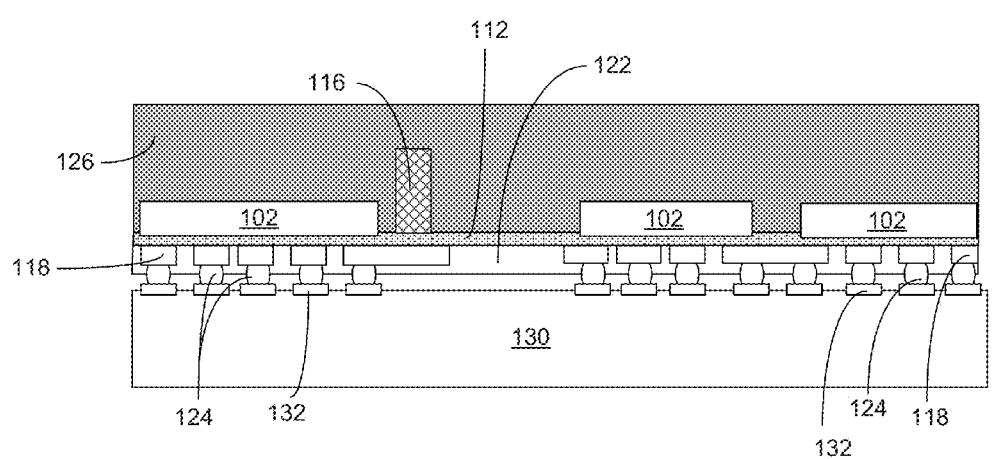
FIG. 3 schematically illustrates a cross-section view of an example IC package assembly coupled to a circuit board, in accordance with some embodiments.

In some embodiments, the intermediate layer 112 may substantially fill a gap between the die 102 and the integrated circuit substrate 122 and gaps between the interconnect structures 106, as can be seen for example in FIG. 3. Alternatively, the intermediate layer 112 may partially fill a gap between the die 102 and the integrated circuit substrate 122 and/or gaps between the interconnect structures 106, and the remainder of the gap may be filled by an underfill material, a layer of dielectric/anisotropic film, or another material. In some embodiments, underfill material used to fill the remainder of the gap may be composed of a polymer such as, for example, an acrylic-based or epoxy-based material such as resin materials.

Figure 2:
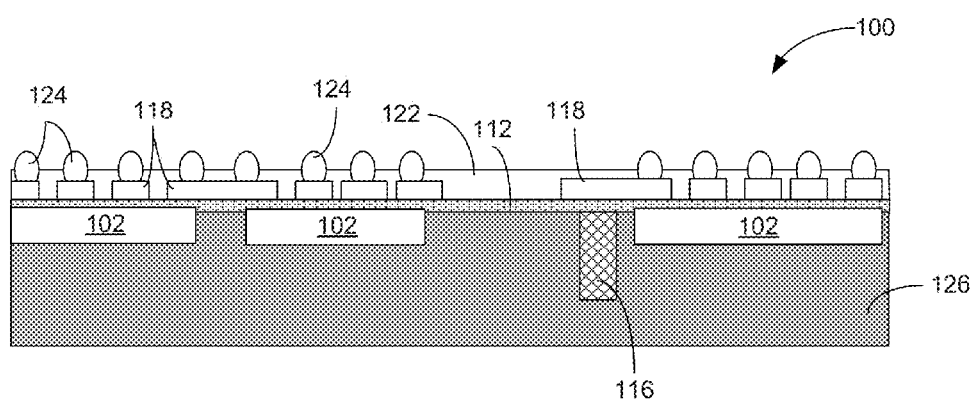
FIG. 2 schematically illustrates a cross-section view of another example IC package assembly, in accordance with some embodiments.

In some embodiments, as shown for example in FIG. 1, intermediate layer 112 may include a dielectric film. In other embodiments, as shown for example in FIG. 2, intermediate layer 112 may include an anisotropic film. In some embodiments, intermediate layer 112 may include a dielectric portion and an anisotropic portion, with the anisotropic portion serving as the interconnect between some components and the interconnect structures 106 serving as the interconnect between other components. The anisotropic film or anisotropic portion may be configured to conduct electrical signals in an out-of-plane direction, relative to a plane formed by the interface layer, between the die and the integrated circuit substrate.

FIG. 3 schematically illustrates a cross-section view of an example IC package assembly coupled to a circuit board, in accordance with some embodiments. In some embodiments, the circuit board 130 may be a printed circuit board (PCB) composed of an electrically insulating material such as an epoxy laminate. For example, the circuit board 130 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Structures (not shown) such as traces, trenches, vias may be formed through the electrically insulating layers to route the electrical signals of the die(s) 102 through the circuit board 130. The circuit board 130 may be composed of other suitable materials in other embodiments.

Only a portion of the circuit board 130 may be depicted in FIG. 3. The circuit board 130 may include other electrical devices coupled to the circuit board that are configured to route electrical signals to or from the die(s) 102 through the circuit board 130. The circuit board 130 may be a motherboard (e.g., motherboard 1402 of FIG. 14) in some embodiments.

Figure 4:
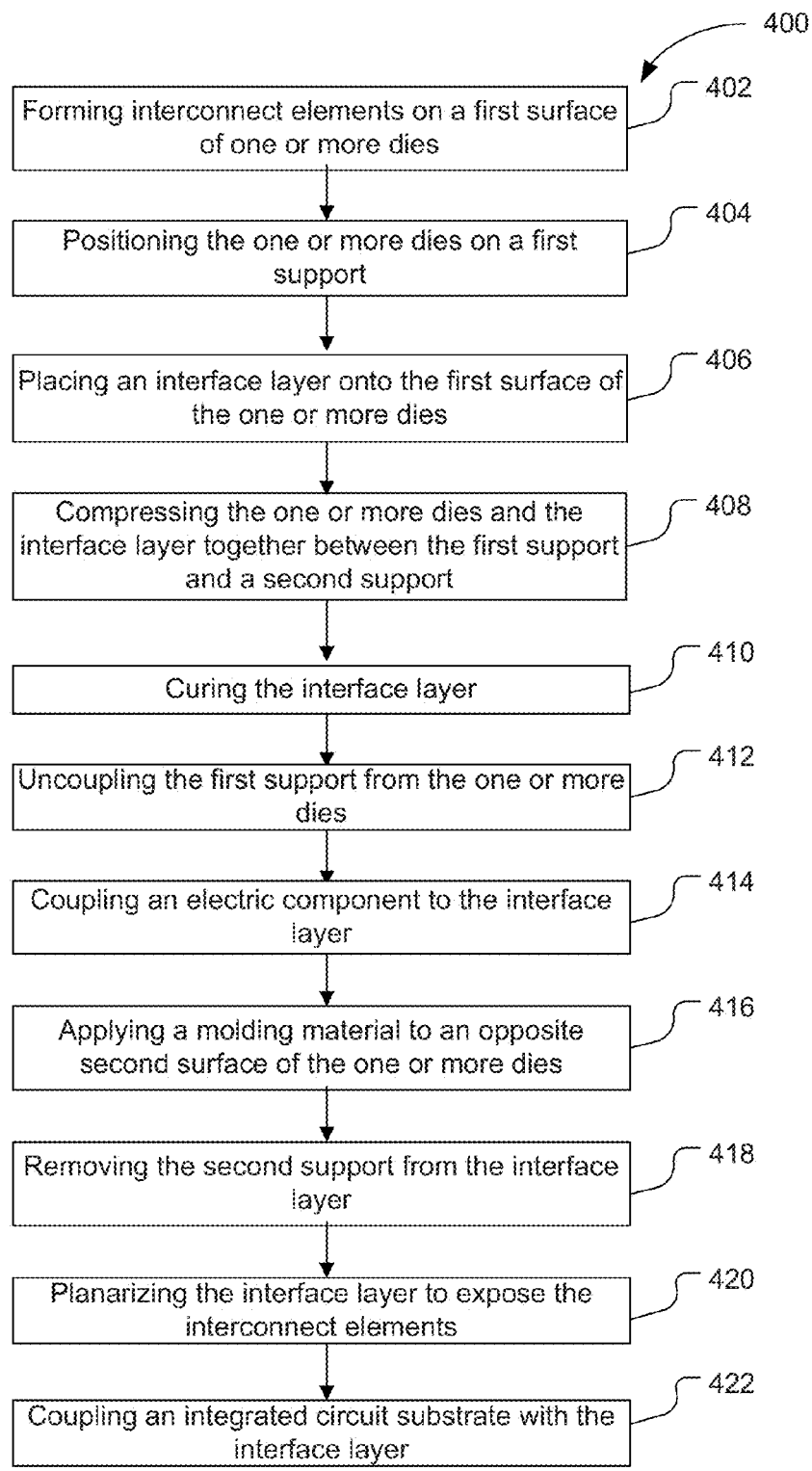
FIG. 4 is a flow diagram for a method of fabricating an IC package assembly, in accordance with some embodiments.

FIG. 4 is a flow diagram for a method of fabricating an IC package assembly (e.g., IC package assembly 100 of FIG. 1 or FIG. 2), in accordance with some embodiments. The method 400 may comport with embodiments described in connection with FIGS. 1-3 and 5-14.

At 402, the method 400 may include forming interconnect structures (e.g., interconnect structures 106) on a first surface of one or more dies. Other embodiments, as shown for example in FIG. 2, may lack 402. For example, 402 may be omitted in embodiments that include an anisotropic film as the interface layer 112.

Figure 5:
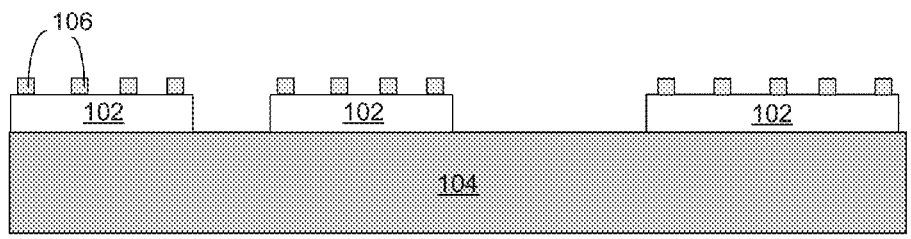
FIGS. 5-13 schematically illustrate an IC package assembly during or subsequent to various fabrication operations.
Figure 6:
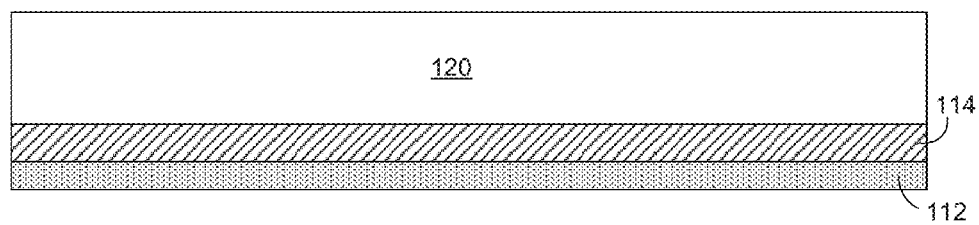
Figure 7:
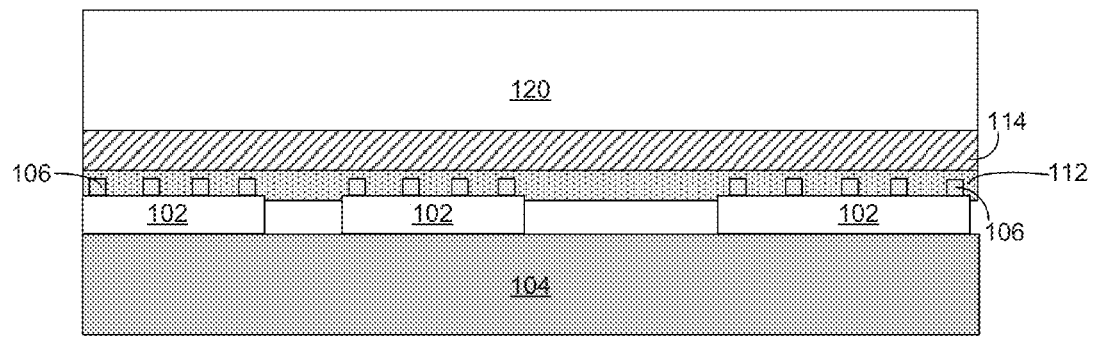
Figure 8:
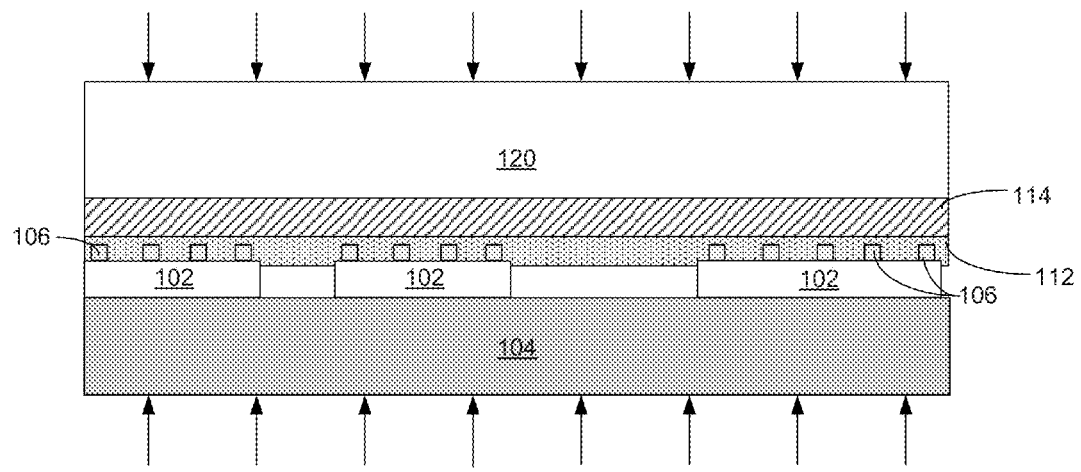
Figure 9:
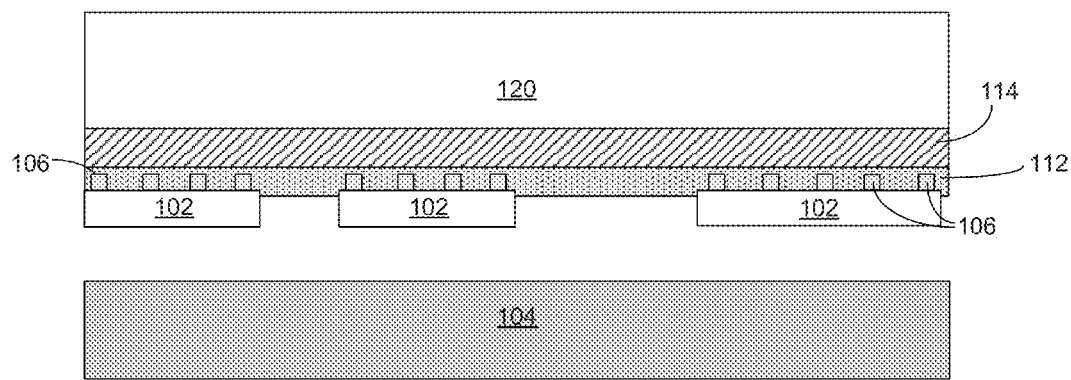
Figure 10:
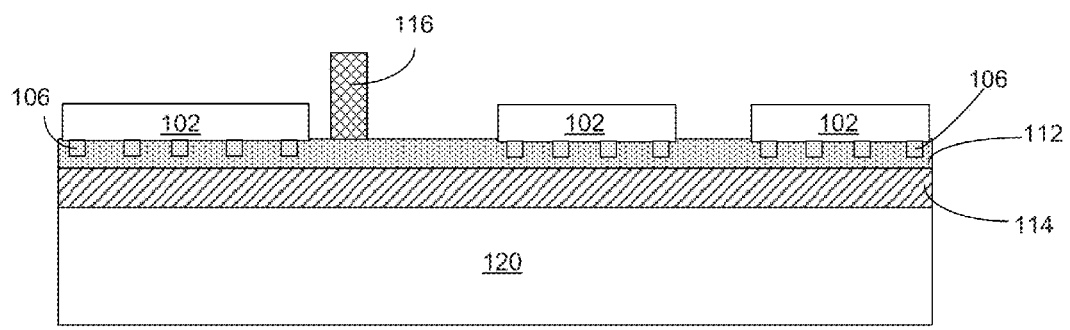

At 404, the method 400 may include positioning the one or more dies (e.g., dies 102) on a first support (e.g., support 104). As shown in FIG. 5, the die(s) 102 may be positioned 'face up' on the first support such that an active first surface or side of the die with interconnect structures 106, if any, are exposed, and an opposite second surface or side of the die is in contact with the support 104. In some embodiments, support 104 may have a layer of bonding/adhesive material onto which die(s) 104 are placed in a desired position and retained. In some embodiments, a chucking system (e.g., vacuum or electrostatic) may be used to position the die(s) 102 on the support 104. For example, the support 104 may be made of a porous material, and a vacuum may be applied to retain the die(s) 102 in the desired positions on the support 104. The opposite second surface(s) of the die(s) 102 may be polished before positioning the die(s) 102 on the first support 104.

At 406, the method 400 may further include placing an interface layer onto the first surface of the die(s) 102. As shown for example in FIG. 6, the interface layer 112 may be coupled to a second support 120. In some embodiments, the interface layer 112 may be, or may include, a die-attach-film (DAF). In some embodiments, the interface layer 112 may include a dielectric film, an anisotropic film, or a film with a dielectric portion and an anisotropic portion, and/or an adhesive (e.g., a thermoplastic adhesive, an epoxy, a resin). The interface layer 112 may be a continuous layer (see e.g., FIG. 2) or a discontinuous layer (see e.g., FIG. 1). In some embodiments, the interface layer 112 may be applied to the second support 120 as a continuous film layer and subsequently processed to become a discontinuous layer (e.g., by laser, etching, and/or planarizing the interface layer).

In some embodiments, an intermediate layer 114 may be disposed between the second support 120 and the interface layer 112. Intermediate layer 114 may be configured to release the interface layer 112 from the second support 120 in response to a particular condition. In some embodiments, intermediate layer 114 may be, or may include, a material that dissolves, disintegrates, degrades, and/or becomes liquid or semi-solid upon exposure to a particular condition (e.g., light, heat, a chemical, a change in pH, a solvent). In some embodiments, the intermediate layer 114 may include one or more polymers (e.g., a supramolecular polymer, a dendritic polymer, a hyperbranched polymer, a copolymer). In some embodiments, the intermediate layer 114 may include a dendritic or hyperbranched polymer that softens, becomes a low-viscosity liquid, sublimates, or vaporizes at a predetermined temperature. In some embodiments, the intermediate layer 114 may be dissolvable in a polar or non-polar solvent. Other embodiments may lack an intermediate layer 114. In those embodiments, the interface layer 112 may be coupled to the second support 120 by vacuum pressure, electrostatic force, or by other known methods.

The interface layer 112 and/or the intermediate layer 114 may be applied to a surface of the second support 120 by known methods (e.g., heat, compression). In some embodiments, the interface layer 112 and/or the intermediate layer 114 may be deposited selectively/discontinuously to form a discontinuous layer. In some embodiments, the intermediate layer 114 may be applied to the second support 120 by spraying, spin-coating, laminating, or other known methods, and the interface layer 112 may be subsequently applied to the intermediate layer 114 in a separate process. In other embodiments, the interface layer 112 and the intermediate layer 114 may be applied to the second support 120 in a single process. For example, the intermediate layer 114 may be formed on the interface layer 112 before applying the intermediate layer 114 and the interface layer 112 to the second support 120.

In some embodiments, a substance that expands in response to an increase in temperature may be provided within intermediate layer 114 or between intermediate layer 114 and an adjacent structure (e.g., interface layer 112, second support 120, a handling layer). For example, intermediate layer 114 may be deposited around the periphery of a surface of second support 120, and the interface layer 112 may be coupled to the intermediate layer 114, leaving an air pocket between the surface of the second support 120 and the interface layer 112. Applying heat to the intermediate layer 114 may cause the air pocket to expand, resulting in the separation of the second support 120 from the interface layer 112.

At 408, the method 400 may further include compressing the one or more dies and the interface layer between the first support and the second support. As shown for example in FIGS. 7 and 8, the dies 102 and the interface layer 112 may be positioned between the first support 104 and the second support 120. Force may be applied to one or both of supports 104/120 to compress the dies 102 and the interface layer 112 together. In some embodiments, force may be applied in an upward direction to the bottom of the first support 104 and/or in a downward direction to the top of the second support 120. In some embodiments, the compression may be done in a pressure-controlled chamber (e.g., an autoclave or other type of batch oven), and may include increasing or decreasing the pressure within the chamber (e.g., within a range of a low vacuum pressure of 0.01 atm or less to a high pressure of around 10 atm).

At 410, the method 400 may include curing the interface layer. Curing the interface layer may include applying heat during or after the compression of the dies 102 and the interface layer 112 between the first and second supports 104/120. For example, the components may be heated (during or after the compression) in a chamber at a predetermined temperature or range of temperatures (e.g., 80-200° C., 100-180° C., 150-170° C., 170-230° C.). The duration of heating may vary among embodiments (e.g., from 100 seconds to several hours, depending on the material choices). The pressure from the supports 104/120 and/or within the chamber may reduce or prevent shifting of the die(s) 102 from the desired position(s) on the first support 104 during the compression/heating. Applying heat to the components may reduce or eliminate voids between the dies(s) 102 and the interface layer 112. In some embodiments, the interface layer 112 may have sufficient volume to fill the spaces between the die(s) 102, and/or between the die(s) 102 and other components (e.g., the integrated circuit substrate 122). Alternatively, one or more other materials (e.g., underfill material, molding material, DAF film, etc.) may be used to fill a remaining space At 412, the method 400 may further include uncoupling the first support from the one or more dies (see e.g., FIG. 9). In some embodiments, uncoupling the first support 104 from the one or more dies may include lifting the second support 120 and components coupled thereto (e.g., interface layer 112, dies 102) away from the first support 104, or vice versa. In some embodiments, the first support 104 may be coupled to the die(s) 102 by negative/vacuum pressure until positive pressure is applied during/after the compressing/curing of the interface layer 112. The release of the negative/vacuum pressure may allow the first support 104 to be removed from the die(s) 102. In other embodiments, a bonding layer or adhesive disposed between the surface of the first support 104 and the opposite second side(s) of the die(s) 102 may be removed by heating, light, a laser, a solvent, or mechanical force to remove the first support 104 from the die(s) 102.

At 414, the method 400 may include coupling an electronic component 116 to the interface layer 112. As shown for example in FIG. 10, the second support 120 may be rotated or inverted to position the die(s) 102 above the second support 120. One or more electronic components 116 (e.g., a clock, a crystal, a capacitor) may be positioned on the interface layer 112. For example, a component that does not require high placement accuracy may be placed onto the interface layer 112 by a pick-and-place (PnP) tool (e.g., a chip shooter) or by other known methods/devices.

Figure 11:
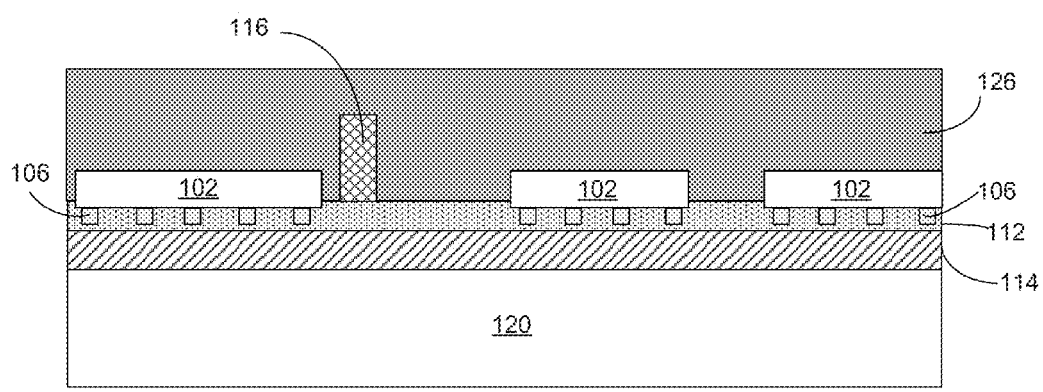

At 416, the method 400 may further include applying a molding material to the opposite second surface of the one or more die(s). The molding material (e.g., molding material 126) may include, for example, epoxy materials or other suitable materials to electrically insulate electrical features of the IC package assembly 100. In the depicted embodiment, the molding material 126 serves as an encapsulant for exposed surface(s) of the die(s) 102. As shown in FIG. 11, the molding material 126 may partially or fully encapsulate the opposite second side of the die(s) 102.

Figure 12:
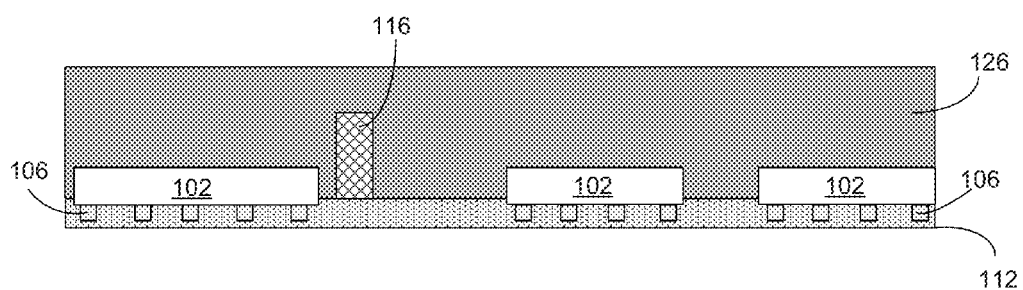
Figure 13:
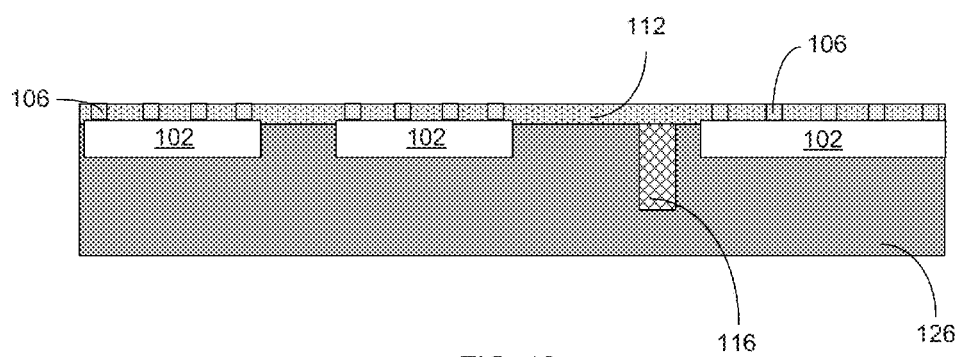

At 418, the method 400 may further include removing the second support from the interface layer. As described above, the intermediate layer 114 may be configured to release the interface layer 112 from the second support 120 in response to a particular condition. Thus, removing the second support 120 from the interface layer 112 may include applying light, heat, a chemical, a change in pH, a solvent, and/or mechanical force to the intermediate layer 114 and/or one or more components attached to the second support 120. In response, the intermediate layer 114 may dissolve, degrade/deteriorate, soften, becomes a low-viscosity liquid, sublimate, or vaporize to release the second support 120 from the interface layer 112. In some embodiments that lack an intermediate layer 114, removing the second support may include releasing negative pressure, applying mechanical force, or neutralizing an electrostatic force. FIG. 12 schematically illustrates an example IC package assembly subsequent to removal of the second support 120, in accordance with some embodiments.

At 420, the method 400 may include planarizing the interface layer to expose the interconnect element(s) on the die(s). As shown for example in FIG. 13, the components may be flipped or inverted as a unit to position the interface layer 112 above the molding material 126. The interface layer 112 may be planarized to the extent necessary to expose the interconnect elements 106 on the die(s) 102. In some embodiments, the interface layer may be planarized to a depth required to remove a portion of the interconnect elements 106 and/or a coating or other surface treatment on the interconnect elements 106 (e.g., a protective coating).

Some embodiments may lack 420. For example, in some embodiments the interface layer 112 is an anisotropic layer that conducts signals in an out-of-plane direction relative to the plane of the interface layer, and interconnect elements 106 are omitted. In other embodiments, the interconnect elements 106 may be exposed as a result of the curing (e.g., due to melting and flow of the interface layer 112 upon heating).

At 422, the method 400 may include coupling an integrated circuit substrate 122 with the interface layer 112. As described above, the integrated circuit substrate 122 may include one or more interconnect elements 118 (e.g., bond pads). In some embodiments, the die(s) 102 may lack interconnect structures 106, and coupling the integrated circuit substrate 122 to the interface layer 112 may include placing the interface layer 112 against the integrated circuit substrate 122 and applying heat and/or pressure to those components. For example, pressure may be applied to the molding material 126 and/or to the integrated circuit substrate 122 to compress the integrated circuit substrate 122 against the interface layer 112. As another example, heat may be applied to the components (e.g., in an autoclave or other type of oven) to bond the integrated circuit substrate 122 to the interface layer 112. Alternatively, both heat and pressure may be applied simultaneously or asynchronously.

In other embodiments, interconnect structures 106 may be exposed along the surface of the interface layer 112, and coupling the integrated circuit substrate 122 to the interface layer 112 may include aligning the interconnect structures 106 with the interconnect elements 118 and heating the IC package to soften or melt the interconnect structures 106. This may cause the interconnect structures 106 to bond to the interconnect elements 118. In some embodiments, pressure may be applied to compress the interconnect structures 106 and interface layer 112 against the integrated circuit substrate 122 during and/or subsequent to heating the IC package.

In some embodiments, method 400 may further include forming one or more vias in the interface layer 112. For example, in some embodiments the interface layer 112 may include a dielectric portion disposed over an electronic component or portion of a die 102. A via may be formed in the dielectric portion by known methods (e.g., laser) to connect the component or portion of the die to the integrated circuit substrate 122. Alternatively, vias may be omitted in some embodiments. For example, vias may be omitted in embodiments with an interface layer 112 that is anisotropic and/or has anisotropic portions connecting each die/electronic component to the integrated circuit substrate.

In some embodiments, method 400 may further include coupling a circuit board to the IC package assembly. As shown for example in FIG. 3, a circuit board (e.g., circuit board 130) may be coupled to the integrated circuit substrate 122. In some embodiments, coupling the circuit board 130 to the IC package assembly (e.g., IC package assembly 100) may include coupling interconnect structures 124 (e.g., solder balls) to the interconnect elements 118 of the integrated circuit substrate 122 and to corresponding interconnect elements 132 (e.g., bond pads) of the circuit board 130 to form corresponding solder joints that are configured to further route the electrical signals of the die(s) 102 to the circuit board 130.

Figure 14:
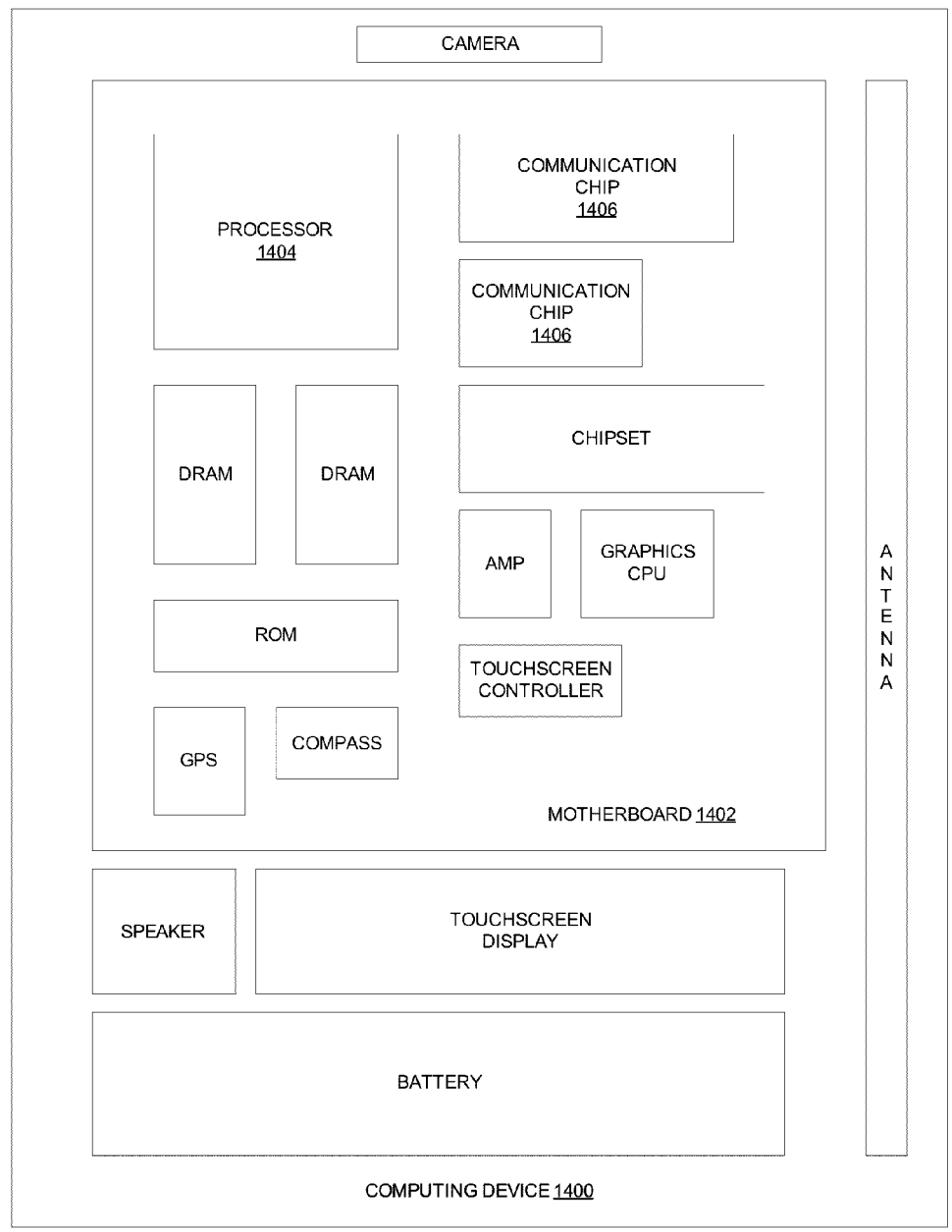
FIG. 14 schematically illustrates a computing device in accordance with one implementation of the invention.

Various operations are described as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired. FIG. 14 schematically illustrates a computing device 1400 in accordance with one implementation of the invention. The computing device 1400 may house a board such as motherboard 1402. The motherboard 1402 may include a number of components, including but not limited to a processor 1404 and at least one communication chip 1406. The processor 1404 may be physically and electrically coupled to the motherboard 1402. In some implementations, the at least one communication chip 1406 may also be physically and electrically coupled to the motherboard 1402. In further implementations, the communication chip 1406 may be part of the processor 1404.

Depending on its applications, computing device 1400 may include other components that may or may not be physically and electrically coupled to the motherboard 1402. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1406 may enable wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1406 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 1406 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1406 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1406 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1406 may operate in accordance with other wireless protocols in other embodiments.

The computing device 1400 may include a plurality of communication chips 1406. For instance, a first communication chip 1406 may be dedicated to shorter range wireless communications such as Wi-Fi and Bluetooth and a second communication chip 1406 may be dedicated to longer range wireless communications such as GPS, EDGE, GPRS, CDMA, WiMAX, LTE, Ev-DO, and others.

The processor 1404 of the computing device 1400 may include a die (e.g., a first die 102 or a second die 102 of FIG. 1 or 2) in an IC package assembly (e.g., IC package assembly 100 of FIG. 1 or 2) as described herein. The term "processor" may refer to any device or portion of a device that processes electronic data from registers and/or memory to transform that electronic data into other electronic data that may be stored in registers and/or memory.

The communication chip 1406 may also include a die (e.g., a first die 102 or a second die 102 of FIG. 1 or 2) in an IC package assembly (e.g., IC package assembly 100 of FIG. 1 or 2) as described herein. In further implementations, another component (e.g., memory device or other integrated circuit device) housed within the computing device 1400 may contain a die (e.g., first die 102 or second die 102 of FIG. 1 or 2) in an IC package assembly (e.g., IC package assembly 100 of FIG. 1 or 2) as described herein.

The computing device 1400 may be configured to execute instructions stored on a storage medium described herein to perform various actions. In various implementations, the computing device 1400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1400 may be any other electronic device that processes data.

Embodiments of the present disclosure may provide IC packages with improved performance, lower cost and/or reduced size (e.g., for smaller form factors). Techniques and configurations in accordance with embodiments described herein may be applied to CPU's/processors, chipsets, graphics devices, wireless devices, and/or multi-chip/3D packages that include a CPU in combination with one or more other devices. As compared to prior techniques and configurations, embodiments disclosed herein may provide higher via density between chips/dies, higher routing density between chips/dies, and/or improved component (chip/die) to component (chip/die) alignment (e.g., from standard deviation of 15 µm to less than 5 µm, or from standard deviation of 15 µm to around 2 µm).

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. A method, comprising:
affixing one or more dies to a first support;
affixing an interface layer to a second support;
applying a force to one of the first support or the second support, wherein the force causes the one of the first support or second support to move toward an other of the first support or the second support, and wherein the interface layer is compressed to a first side of the one or more dies in response to the movement;
separating the one or more dies from the first support; and
applying a molding material to a second side of the one or more dies.

2. The method of claim 1, further including curing the interface layer while the interface layer is compressed to the first side of the one or more dies.

3. The method of claim 1, wherein applying the molding material to the second side of the one or more dies by includes inverting the second support and applying the molding material to the second side of the one or more dies while the second support is inverted.

4. The method of claim 3, further including coupling an electronic component to the interface layer while the second support is inverted, wherein applying the molding material further includes applying the molding material to the electronic component.

5. The method of claim 4, wherein coupling the electronic component to the interface layer comprises placing the electronic component onto a dielectric portion of the interface layer, and the method further includes creating an interconnect structure through the dielectric portion to the electronic component.

6. The method of claim 4, wherein the electronic component is coupled to the interface layer by a surface mount technology component placement system.

7. The method of claim 3, further including separating the second support from the interface layer.

8. The method of claim 1, further including:
prior to applying the force, forming an interconnect structure on a first surface of at least one of the one or more dies opposite a second surface to be affixed to the first support;
separating the second support from the interface layer; and
planarizing the interface layer to expose the interconnect structure.

9. The method of claim 8, further comprising coupling an integrated circuit substrate with the interface layer and the interconnect structure.

10. The method of claim 1, wherein the interface layer is affixed to the second support via a releasable layer disposed between the second support and the interface layer.

11. The method of claim 1, wherein the interface layer comprises an anisotropic portion configured to conduct electrical signals in an out-of-plane direction relative to a plane formed by the interface layer.

12. The method of claim 11, further comprising coupling an integrated circuit substrate with the interface layer, wherein the anisotropic conductive portion is configured to conduct electrical signals between the one or more dies and the integrated circuit substrate.

13. The method of claim 1, wherein the one or more dies comprises at least two dies, and the interface layer comprises an anisotropic conductive film connected with surfaces of the at least two dies.

14. The method of claim 13, wherein the method further includes connecting an integrated circuit substrate directly to the anisotropic conductive film, and the anisotropic conductive film is configured to conduct electrical signals between the integrated circuit substrate and one or more of the at least two dies.

15. The method of claim 1, wherein affixing the one or more dies to the first support includes affixing the one or more dies to the first support by an adhesive material located intermediate the one or more dies and the first support.

16. The method of claim 1, wherein affixing the interface layer to the second support includes attaching the interface layer to the second support layer by an intermediate layer disposed between the second support and the interface layer, wherein the method further comprises separating the interface layer from the second support.

17. The method of claim 16, wherein separating the interface layer from the second support includes the intermediate layer dissolving, disintegrating, degrading, becoming liquid, or becoming semi-solid.

18. The method of claim 16, wherein separating the interface layer from the second support includes exposing the intermediate layer to light.

19. The method of claim 16, wherein separating the interface layer from the second support includes exposing the intermediate layer to heat.

20. The method of claim 16, wherein separating the interface layer from the second support includes exposing the intermediate layer to a chemical.

21. The method of claim 16, wherein separating the interface layer from the second support includes exposing the intermediate layer to a change in pH.

22. The method of claim 1, wherein affixing the interface layer to the second support includes depositing an intermediate layer on the second support and affixing the interface layer to the second support via the intermediate layer, wherein the intermediate layer includes a substance that expands in response to an increase in temperature, and wherein the method further comprises applying heat to the intermediate layer causing the substance to expand and separate the interface layer from the second support.

23. The method of claim 22, wherein depositing the intermediate layer on the interface layer includes depositing the intermediate layer around a periphery of a side of the second support, and wherein affixing the interface layer to the second support includes affixing the interface layer to the side of the second support via the intermediate layer, wherein an air pocket is formed, within the intermediate layer, between the interface layer and the side of the second support.

* * * * *

UNITED STATES PATENT AND TRADEMARK OFFICE
CERTIFICATE OF CORRECTION

PATENT NO. : 9,543,197 B2  
APPLICATION NO. : 13/719836  
DATED : January 10, 2017  
INVENTOR(S) : Chuan Hu et al.

Page 1 of 1

It is certified that error appears in the above-identified patent and that said Letters Patent is hereby corrected as shown below:

In the Claims

Column 12  
Lines 10-11, "...or more dies by includes..." should read --...or more dies includes...--

Signed and Sealed this  
Twentieth Day of June, 2017

Joseph Matal  
*Performing the Functions and Duties of the*  
*Under Secretary of Commerce for Intellectual Property and*  
*Director of the United States Patent and Trademark Office*